United States Patent
Kliesch et al.

(10) Patent No.: US 7,083,848 B2
(45) Date of Patent: *Aug. 1, 2006

(54) SINGLE- OR MULTILAYER THERMOPLASTIC POLYMER FILM CAPABLE OF STRUCTURING BY MEANS OF ELECTROMAGNETIC RADIATION, PROCESS FOR ITS PRODUCTION, AND ITS USE

(75) Inventors: Holger Kliesch, Mainz (DE); Thorsten Kiehne, Wiesbaden (DE); Gottfried Hilkert, Saulheim (DE); Ingo Fischer, Heistenbach (DE)

(73) Assignee: Mitsubishi Polyester Film GmbH, Wiesbaden (DE)

( * ) Notice: Subject to any disclaimer, the term of this patent is extended or adjusted under 35 U.S.C. 154(b) by 60 days.

This patent is subject to a terminal disclaimer.

(21) Appl. No.: 11/037,624

(22) Filed: Jan. 18, 2005

(65) Prior Publication Data

US 2005/0164022 A1 Jul. 28, 2005

(30) Foreign Application Priority Data

Dec. 7, 2004 (DE) ............ 10 2004 003 890

(51) Int. Cl.
*B32B 27/08* (2006.01)
*B32B 27/18* (2006.01)
*B32B 27/20* (2006.01)
*B32B 27/34* (2006.01)
*B32B 27/36* (2006.01)

(52) U.S. Cl. ............ 428/215; 428/212; 428/213; 428/323; 428/331; 428/328; 428/329; 428/332; 428/338; 428/339; 428/480; 428/910; 428/474.4; 428/423.1; 264/288.4; 264/290.2; 522/81; 522/83; 524/401; 524/402; 524/406; 524/434; 524/435; 524/439; 524/440

(58) Field of Classification Search .......... None
See application file for complete search history.

(56) References Cited

U.S. PATENT DOCUMENTS

| | | | |
|---|---|---|---|
| 4,328,303 A | * | 5/1982 | Ronn et al. ............ 430/290 |
| 5,334,292 A | * | 8/1994 | Rajeshwar et al. ...... 205/419 |

(Continued)

FOREIGN PATENT DOCUMENTS

EP 1 274 288 A1 1/2003

OTHER PUBLICATIONS

Schimtz, Peter et al., "Films." Ullmann's Encyclopedia of Industrial Chemistry, 5th Ed., vol. A11 (1988), pp. 85-95, 105-106, 108-110.*

*Primary Examiner*—Vivian Chen
(74) *Attorney, Agent, or Firm*—ProPat, L.L.C.

(57) ABSTRACT

The invention relates to a single- or multilayer, oriented film in which at least one layer is comprised of a thermoplastic polymer having a minimum amount of amide groups. The polymer is a polyester, a polyamide, or a mixture comprised of polyester and polyamide, or is a copolymer comprised of these two materials. The film also comprises a component a) which, when irradiated with electromagnetic or particulate radiation, forms metal nuclei onto which further metal can be accumulated in further steps of the process. The invention also relates to a process for the production of this film, and to its use in printed circuit boards, ribbon cables, smart cards, RFID labels, membrane keyboards, or film-based circuits of any type.

20 Claims, 1 Drawing Sheet

U.S. PATENT DOCUMENTS

| | | | |
|---|---|---|---|
| 5,517,338 A * | 5/1996 | Vaughn et al. | 359/15 |
| 5,637,440 A * | 6/1997 | Ogi et al. | 430/270.1 |
| 5,728,339 A * | 3/1998 | Farrar | 264/134 |
| 6,218,083 B1 * | 4/2001 | McCullough et al. | 430/326 |
| 6,319,564 B1 * | 11/2001 | Naundorf et al. | 427/531 |
| 6,447,884 B1 * | 9/2002 | Burberry et al. | 428/32.39 |
| 2002/0065346 A1 * | 5/2002 | Murschall et al. | 524/323 |
| 2003/0087105 A1 * | 5/2003 | Murschall et al. | 428/423.7 |
| 2003/0108754 A1 * | 6/2003 | Murschall et al. | 428/480 |
| 2005/0064711 A1 * | 3/2005 | Kliesch et al. | 438/689 |
| 2005/0069688 A1 * | 3/2005 | Kliesch et al. | 428/220 |
| 2005/0069689 A1 * | 3/2005 | Kliesch et al. | 428/220 |

* cited by examiner

Figure 1

SINGLE- OR MULTILAYER THERMOPLASTIC POLYMER FILM CAPABLE OF STRUCTURING BY MEANS OF ELECTROMAGNETIC RADIATION, PROCESS FOR ITS PRODUCTION, AND ITS USE

CROSS-REFERENCE TO RELATED APPLICATIONS

This application claims priority to parent application no. 10 2004 003 890.02, filed in the Federal Republic of Germany on Jan. 27, 2004, hereby incorporated by reference herein in its entirety.

FIELD OF THE INVENTION

The invention relates to a single- or multilayer, oriented film in which at least one layer is comprised of a thermoplastic polymer having a minimum amount of amide groups. The polymer is a polyester, a polyamide, or a mixture comprised of polyester and polyamide, or a copolymer comprised of these two materials. The film also comprises a component a) which, on irradiation with electromagnetic or particulate radiation, forms metal nuclei onto which further metal can be deposited in further steps of the process. The invention also relates to a process for the production of this film and to its use in printed circuit boards, ribbon cables, smart cards, RFID labels, membrane keyboards, or film-based circuits of any type.

BACKGROUND OF THE INVENTION

The use of polyester films for electrical insulation applications is known in the art. There are ever-more-stringent requirements for circuits to achieve complexity in a small space, and these circuits have to be capable of rapid, flexible, and low-cost production, the result being a high level of technological requirements placed upon the film and on the steps of further processing.

Conventional processes for the production of flexible circuits mostly relate to full-surface metallization of the film web, or lamination of the film web to metal foil, and then structuring of the resultant conductive surfaces by various methods, e.g. etching or mechanical removal of the undesired amounts of metal. There are also processes which apply the metal by stamping or printing, or a conductive paste comprised of carbon/silver is applied. Disadvantages of these processes are their low flexibility and precision, the result being a relatively large separation between the conductor tracks and/or the high costs associated with these processes, and/or the low production speeds.

EP-A-1 274 288 describes a process which, starting from copper-containing metal oxides, copper nuclei are formed via laser irradiation, and further copper is deposited onto these in a subsequent electroplating step. That specification describes exclusively injection moldings, and no indication is given as to whether and how the process can be applied for polyester films and films generally. In particular, there is no indication as to what types of polymers and additives are required to produce oriented films. The PBT/SiO$_2$/spinel compounded material described in EP-A-1 274 288 is unsuitable for the production of oriented films, because the polybutylene terephthalate used has a high crystallization rate and a high fumed silica filler level, and is therefore not capable of reliable processing.

In particular, there is no indication as to how it is possible to produce a film with adequate dimensional stability under conditions of local heating after irradiation with electromagnetic radiation and further processing.

Another problem with films, due to low layer thickness, is that the absorption of radiation is insufficient, and therefore the amount of energy absorbed can sometimes be insufficient, to initiate the conversion of the metal salts into the elemental metals. A very high concentration of the activatable metal compounds therefore has to be added, and this is undesirable in the case of heavy metal compounds such as copper compounds, for environmental reasons.

Another particular problem with films is the high flexibility of the film web. The result is that the conductor track is subject to much higher mechanical stress than is the case with an injection molding. Adhesion to the metal is therefore very important. The prior art gives no indication relating to this matter.

SUMMARY OF THE INVENTION

It is an object of the present invention to provide a film which does not have the disadvantages mentioned and which comprises a compound capable of activation by radiation and forming metal nuclei on which further metal can be deposited in further steps of the process. This film is moreover not only to be capable of cost-effective production and to have good orientability, but also to have good mechanical properties, i.e. high longitudinal and transverse modulus of elasticity, and also defined shrinkage.

DETAILED DESCRIPTION OF THE INVENTION

This object is achieved via a single- or multilayer, at least monoaxially stretched film with a thickness of from 5 to 500 μm, in which at least one layer is comprised of a film of a thermoplastic polymer having a minimum amount of amide groups. The film also comprises from 0.5 to 15% by weight of a component a) which, when irradiated with electromagnetic or particulate radiation, forms metal nuclei onto which further metal can be deposited in further steps of the process.

The thermoplastic polymer is a polyester, a polyamide, or a mixture comprised of polyester and polyamide, or a copolymer comprised of the two materials.

The preferred thickness of the film is from 12 to 200 μm, in particular from 30 to 150 μm, and the film preferably comprises from 1.5 to 10% by weight of component a), in particular from 2 to 8% by weight.

The compound a) capable of activation by radiation is a metal-containing (inorganic or organic) compound which as a consequence of absorption of electromagnetic radiation liberates metal in elemental form, in a chemical reaction. This chemical reaction may also take place with participation of other reactants. It is also possible that the electromagnetic radiation is not directly absorbed by the metal-containing compound, but is absorbed by other substances which then transfer the absorbed energy to the metal-containing compound and thus bring about the liberation of elemental metal. The electromagnetic radiation may be UV light (wavelength from 100 to 400 nm), visible light (wavelength from 400 to 800 nm), or infrared light (wavelength from 800 to 25 000 nm). Other preferred forms of radiation are X-rays, gamma rays, and particle beams (electron beams, α-particle beams, and β-particle beams).

The deposition of further metal onto the metal nuclei generated by electromagnetic radiation preferably takes place via electroplating (solution-chemistry) processes.

Good orientability includes excellent capability of the film to undergo monoaxial or biaxial orientation, without break-offs, during its production.

Good mechanical properties include high modulus of elasticity in at least one film direction (longitudinal direction (MD) and/or transverse direction (TD)), of $\geq 500$ N/mm$^2$, preferably $\geq 2000$ N/mm$^2$ and particularly preferably $\geq 4000$ N/mm$^2$.

In one preferred embodiment, the film of the invention has no shrinkage >25% in any film direction (MD or TD) at 200° C. Shrinkage at 200° C. is preferably $\leq 15\%$, in particular $\leq 5\%$.

The inventive film comprises, as main polymer constituent, based on each layer (i.e. to an extent of from 55 to 100% by weight, preferably from 70 to 100% by weight, and particularly preferably from 90 to 100% by weight) a polyester or a polyamide.

The layer which comprises component a) capable of activation by radiation comprises at least 1% by weight of polyamide, preferably at least 3% by weight, and particularly preferably at least 10% by weight of polyamide.

According to the invention, a polyester is homopolyester copolyester blends of various polyesters, and these may be used either in the form of pure polymers or else in the form of polyesters comprising recycled material.

Polyesters contain repeat units which derive from dicarboxylic acids (100 mol %) and from diols (likewise 100 mol %). The inventive polyesters are preferably based on terephthalic acid or 2,6-naphthalenedicarboxylic acid as dicarboxylic acid and on ethylene glycol or 1,4-butanediol as diol (PET, PBT and PEN).

In particular, the inventive polyesters contain from 10 to 100 mol % of terephthalate or from 10 to 100 mol % of 2,6-naphthalate as dicarboxylic acid components (the total amount of dicarboxylic acid components making up 100 mol %). Other dicarboxylic acid components which may be present in the inventive polyester are from 0 to 50 mol % of 2,6-naphthalate (if terephthalate was used as main component), from 0 to 50 mol % of terephthalate (if naphthalate was used as main component), from 0 to 20 mol % of isophthalate (preferably from 0.5 to 4 mol %), and also from 10 to 60 mol % of 4,4'-diphenyldicarboxylate. Other dicarboxylic acid components, such as 1,5-naphthalenedicarboxylate, should not exceed a proportion of 30 mol %, preferably 10 mol %, in particular 2 mol %.

As diol component, the inventive polyester contains from 10 to 100 mol % of ethylene glycol (EG) (the entire amount of diol components making up 100 mol %). If mixtures of different diols are used, it is advantageous if the proportion of diethylene glycol does not exceed 10 mol %, the amount preferably used being from 0.5 to 5 mol %. Other diol components, such as cyclohexanedimethanol, 1,3-propanediol, 1,4-butanediol, should advantageously not exceed a proportion of 50 mol %, their proportion preferably being less than 30 mol %, particularly preferably less than 10 mol %.

The polyesters mentioned can also be used in the form of mixtures.

According to the invention, a polyamide is homopolyamides, copolyamides, blends of various polyamides, and these may be used either in the form of pure polymers or else in the form of polyamides comprising recycled material.

The polyamides are preferably semicrystalline polyamides, such as nylon-6, nylon-6,6, nylon-6,12, MXD6, or blends of these. Alongside these semicrystalline polyamides, preference is also given to amorphous polyamides, such as hexamethyleneisophthalamide-hexamethyleneterephthalamide copolymer, also known as nylon-6,I/6,T, or its blends with hexamethyleneisophthalamide (e.g. "SELAR® PA" from Dupont or "GRIVORY®" from EMS Chemie). Other polyamides may replace the polyamides mentioned to some extent or entirely.

Alongside the main polymer constituents mentioned, up to 45% by weight, preferably up to 30% by weight, particularly preferably up to 20% by weight, based on the weight of the film, of other polymers, such as polyetherimides (e.g. ULTEM® 1000 from GE Plastics Europe (NL)), polycarbonates (e.g. MAKROLON® from Bayer (DE), polyolefins, such as COCs (e.g. TOPAS® from Ticona (DE)), polyamides (ULTRAMID® from BASF, (DE)), inter alia, may be present in other embodiments of the film.

The polyesters and the polyamides are generally prepared by processes known from the literature. The polyesters may be prepared either by the transesterification process, using the usual catalysts, such as salts of Zn, of Ca, of Li or of Mn, or by the direct esterification process.

The inventive film is either a single-layer or multilayer film. The multilayer films have at least two layers and are comprised of a base layer B, and of at least one outer layer A or C, and, if appropriate, other intermediate layers, preference being particularly given to a three-layer A-B-A or A-B-C structure. For this embodiment it is advantageous for the melt viscosity of the polymer of the base layer B to be similar to that of the outer layer(s) adjacent to the base layer.

The thickness of the outer layer(s) is selected independently of the other layers, and is in the range from 0.1 to 10 µm, preferably from 0.2 to 5 µm, in particular from 1 to 3 µm, and the thickness and constitution of outer layers applied on the two sides may be identical or different. The thickness of the base layer is correspondingly calculated from the difference between the total thickness of the film and the thickness of the outer and intermediate layer(s) applied, and may therefore vary similarly to the total thickness, within wide limits.

In one preferred embodiment of single-layer films, the film comprises from 1 to 35% by weight of polyamide, preferably from 3 to 20% by weight, and particularly preferably from 10 to 15% by weight of polyamide. In the case of multilayer structures, the layer which comprises component a) capable of activation by radiation comprises from 1 to 35% by weight of polyamide, preferably from 3 to 20% by weight, and particularly preferably from 10 to 15% by weight of polyamide. The other layers are preferably comprised of the polyesters described above, and comprise from 0 to 15% by weight of polyamide, preferably from 0.5 to 5% by weight of polyamide.

If constitutions are selected which are mainly comprised of polyamide (more than 50% by weight), this/these layer(s) preferably comprise(s) less than 20% by weight of polyester, and particularly preferably less than 5% by weight of polyester.

The compound a) capable of activation by radiation is comprised of electrically non-conductive high-thermal-stability organic or inorganic metal compounds which are preferably insoluble and stable in aqueous acidic or alkaline metalizing baths. Particularly suitable compounds are those which absorb a very large proportion of the light at the wavelength of the incident light. Compounds of this type are described in EP-A-1 274 288. Preference is given here to compounds of metals of the d and f group of the Periodic Table of the Elements with non-metals. The metal-containing compounds are particularly preferably metal oxides, in particular monooxides of the d-metals of the Periodic Table of the Elements. Higher metal oxides are particularly suitable. In one particularly preferred embodiment of the invention, the higher oxides are spinels, in particular copper-containing spinels, such as $CuCr_2O_4$. Suitable copper-containing spinels are commercially available, an example being PK 3095 from Ferro (DE) or 34E23 or 34E30 from Johnson Matthey (DE). Copper oxides of the formula CuO or $Cu_2O$ are also particularly suitable, and use is preferably made here of nanoparticles, such as NANOARC® Copper Oxide from Nanophase Technologies Corporation, Illinois, USA.

The concentration of these compounds present in the inventive film is from 0.5 to 15% by weight, preferably from 1.5 to 10% by weight, and particularly. preferably from 2 to 8% by weight.

If the metal-containing compound a) is not soluble in the polyester used for the production of the film, the particles have an average size ($d_{50}$ value) of from 0.01 to 20 µm, preferably from 0.02 to 5 µm, and particularly preferably from 0.05 to 3 µm.

Besides the compound a) capable of activation by radiation, the inventive film may comprise other particulate additives, such as fillers and antiblocking agents. Typical fillers and antiblocking agents are inorganic and/or organic particles, such as silicon dioxide (natural, precipitated, or fumed), calcium carbonate, magnesium carbonate, barium carbonate, calcium sulfate, barium sulfate, lithium phosphate, calcium phosphate, magnesium phosphate, titanium dioxide (rutile or anatase), kaolin (hydrated or calcined), aluminum oxide, aluminum silicates, lithium fluoride, the calcium, barium, zinc, or manganese salts of the dicarboxylic acids used, or crosslinked polymer particles, e.g. polystyrene or polymethyl methacrylate particles.

It is also possible to select mixtures of two or more of the abovementioned particle systems or mixtures of particle systems with the same chemical composition but different particle size. The particles are advantageously added to the polymer before melting begins.

If, besides the compound a) capable of activation by radiation, other particulate additives are present in the film, the total concentration of these particles is $\leq 20\%$ by weight, based on the total weight of the film, preferably $\leq 15\%$ by weight, and particularly preferably $\leq 5\%$ by weight. The particulate additives have an average size ($d_{50}$ value) of from 0.01 to 15 µm, preferably from 0.03 to 10 µm, and particularly preferably from 0.05 to 1 µm. In one preferred embodiment, the proportion of particles with $d_{50} \geq 3$ µm to $\leq 2000$ ppm, and particularly preferably $\leq 1000$ ppm.

It has been found that even films without other particulate additives (other than the metal component a) capable of activation by radiation) can be used in the invention. However, formation of the metal nuclei is improved if the film comprises silicon dioxide as filler within the particle sizes and maximum amounts mentioned above. For formation of the metal nuclei it has proven particularly advantageous for the film to comprise from 0.1 to 20% by weight, preferably from 0.5 to 15% by weight, and particularly preferably from 1 to 5% by weight, of silicon dioxide particles with $d_{50} \leq 1$ µm.

$Al_2O_3$ (e.g. AEROXIDE® Alu C from Degussa (DE)) may also be used as an alternative to $SiO_2$. The amounts and particle sizes are the same as those mentioned in the previous paragraph for $SiO_2$.

One preferred embodiment of the inventive film comprises, alongside the metal compound a) capable of activation by radiation, if appropriate, based on the film, an amount of from 0.1 to 15% by weight, preferably from 0.5 to 5% by weight, and particularly preferably from 0.8 to 2% by weight, of another, radiation-absorbing material b). This material preferably absorbs in the wavelength range of the radiation source used to form the metal nuclei.

Preferred materials here are graphite or carbon black, or inorganic or organic black pigments, such as Pigment Black 26 (e.g. $Fe_2O_3/MnO_2/SiO_2/Al_2O_3$ from Anirox Pigments Limited (IN)) or aniline black from Degussa (DE). In the case of carbon blacks and graphites it is advantageous to use grades with low conductivity, such as SPEZIALSCHWARZ® or AEROSPACE15® from Degussa (DE).

The inventive film may comprise other additives, such as UV stabilizers, flame retardants, hydrolysis stabilizers, and antioxidants, and in particular UV stabilizers, such as TINUVIN® from Ciba (CH), also contribute here to improved formation of metal nuclei if use is made of a UV radiation source, because they effectively absorb the energy of the incident UV radiation.

In another embodiment, the inventive film is flame-retardant. Flame-retardant means that in what is known as a fire protection test to UL94 VTM the film achieves at least the classification VTM-2. The film then comprises a flame retardant at a concentration in the range from 0.2 to 30% by weight, preferably from 0.5 to 25% by weight, particularly preferably from 1 to 20% by weight, based on the weight of the film. It is important that the flame retardant is soluble in the polyester, because otherwise the required mechanical properties are not achieved. Examples of suitable flame retardants are organic bromine, chlorine, or nitrogen compounds, or metal hydroxides or metal oxide trihydrates. However, the halogen compounds have the disadvantage that toxic and corrosive hydrogen halides are produced in the event of a fire. Another disadvantage is the low light-resistance of a film equipped therewith. Examples of other suitable flame retardants are organophosphorus compounds, such as carboxyphosphinic acids, their anhydrides, and dimethyl methanephosphonate. Very suitable flame retardants here are those in which the phosphorus compound has chemical bonding to the polyester. Very particular preference is given to bis(2-hydroxyethyl)[(6-oxido-6H-dibenzo[c,e][1,2]oxaphosphorin-6-yl)methyl]butane-dicarboxylate of the formula In this preferred embodiment, the inventive low-flammability film comprises, besides the polymer, the compound capable of activation by radiation, and, if appropriate, particulate additives, from 1 to 20% by weight of an organophosphorus compound as flame retardant soluble in the polymer.

Because the flame retardants generally have some susceptibility to hydrolysis, it may be advisable to add a hydrolysis stabilizer. Examples of suitable hydrolysis stabilizers are polymeric carbodiimides, e.g. STABAXOL® P from Rheinchemie (DE). The amount of these preferably used is from 0.1 to 1% by weight, based on the weight of the film.

These abovementioned proportions of flame retardant and hydrolysis stabilizer have also proven advantageous when the main constituent of the film is not polyethylene terephthalate but another polyester or polyamide.

The compound a) capable of activation by radiation, and also, if appropriate, the radiation-absorbing compound b), and any other additives used, such as particles, UV stabilizers, flame retardants, hydrolysis stabilizers, and antioxidants, may be added in the form of a glycolic dispersion during the polycondensation process to the polyester used for the production of the inventive film. However, it is preferable to add the component capable of activation by radiation and/or any other additives used by way of masterbatches to the polymer during film extrusion.

The film may also be coated to establish other properties. Particularly typical coatings are coatings with adhesion-promoting, antistatic, slip-improving, or release action. Clearly, these additional layers may be applied to the film by way of in-line coating by means of aqueous dispersions after the longitudinal stretching and prior to the transverse stretching.

In one particular embodiment, at least one side of the film has a silicone coating, e.g. as described in U.S. Pat. No. 5,728,339. This embodiment has the advantage that after the laser treatment the surrounding regions have protection from the corrosive action of the electroplating bath, and that residues of the electroplating solution can be removed more easily from the film surface.

For certain applications, it can be advantageous to pretreat the surface of the film chemically, using an acid. For this "adhesion-promoting etch" particularly suitable compounds are trichloroacetic acid, dichloroacetic acid, or hydrofluoric acid, which act on the surface for a short time (from 5 to 120 seconds) and then are removed by means of an air knife. This gives the film a very reactive, amorphous surface.

The additives, i.e. the metal compound a) capable of activation by radiation, and also any other fillers and other additives present, may be introduced into the polymer by means of a commercially available twin-screw extruder. Here, inventive polymer pellets are introduced into the extruder together with the particles/additives and extruded, then quenched in a water bath, and then pelletized.

However, in one preferred process for preparing the inventive polyesters/polyamides, the additives are added directly during the preparation of the polymer.

In the production of the inventive polyesters by the DMT process, the additives are usually added in the form of a glycolic dispersion after the transesterification or directly prior to the polycondensation (e.g. by way of the transport line between transesterification and polycondensation vessels). However, the addition may also take place prior to the transesterification. In the case of the TPA process, the addition preferably takes place at the start of the polycondensation. However, later addition is also possible. In the case of this process it has proven advantageous to filter the glycolic dispersions through a PROGAF PGF 57 (Hayward Ind. USA) filter prior to addition.

The present invention also provides a process for producing the film. Production usually takes place via an extrusion process, for example on an extrusion line. It has proven particularly advantageous to add the component a) capable of activation by radiation and any other additives used, such as component b), particles, UV stabilizers, flame retardants, hydrolysis stabilizers, and antioxidants, in the amounts mentioned in the form of predried or precrystallized masterbatches, prior to the extrusion process.

In masterbatch technology it is preferable that the particle size and the bulk density of the masterbatches are similar to the particle size and the bulk density of the polyester used, thus achieving homogeneous dispersion, resulting in homogeneous properties.

The polyester/polyamide films may be produced in the form of a single-layer or multilayer film by known processes from a polymer and, if appropriate, from other raw materials, at least one component capable of activation by radiation, and also, if appropriate, other additives.

Masterbatches which comprise the component capable of activation by radiation have preferably been pre-crystallized and/or predried. The same applies to masterbatches which comprise the radiation-absorbing component or particles, UV stabilizer(s), flame retardants, and/or other additives. The predrying includes progressive heating of the masterbatches under reduced pressure (from 20 to 80 mbar, preferably from 30 to 60 mbar, in particular from 40 to 50 mbar), with stirring, and, if appropriate, afterdrying at a constant elevated temperature (likewise under reduced pressure). It is preferable for the masterbatches to be charged batchwise at room temperature from a feed vessel in the desired blend together with the polyester and, if appropriate, with other raw material components into a vacuum dryer in which a temperature profile moves from 10 to 160° C., preferably from 20 to 150° C., in particular from 30 to 130° C., during the course of the drying time or residence time. During the residence time of about 6 hours, preferably 5 hours, in particular 4 hours, the raw material mixture is stirred at from 10 to 70 rpm, preferably from 15 to 65 rpm, in particular from 20 to 60 rpm. The resultant precrystallized or predried raw material mixture is afterdried in a downstream vessel, likewise evacuated, at temperatures of from 90 to 180° C., preferably from 100 to 170° C., in particular from 110 to 160° C., for from 2 to 8 hours, preferably from 3 to 7 hours, in particular from 4 to 6 hours.

The masterbatches, and also the other raw materials, may also be directly extruded without predrying if use is made of twin- or multiscrew extruders.

In the preferred coextrusion process for the production of the film, the melts corresponding to the individual layers of the film are co-extruded through a flat film die and quenched in the form of a substantially amorphous prefilm on a chill roll (only one melt being extruded through the die in the case of the inventive single-layer film). This film is then reheated and oriented in at least one direction or in the longitudinal and transverse direction or in the transverse and longitudinal direction or in the longitudinal, transverse, and again the longitudinal and/or transverse direction. The film temperatures in the stretching process are generally above the highest glass transition temperature $T_g$ of the polyester/polyamide used by from 10 to 60° C., and the longitudinal stretching ratio is usually from 2 to 6, in particular from 3 to 4.5, the transverse stretching ratio usually being from 2 to 5, in particular from 3 to 4.5, the ratio for any second longitudinal and transverse stretching carried out usually being from 1.1 to 5. The first longitudinal stretching may also be carried out simultaneously with the transverse stretching (simultaneous stretching) or in any conceivable sequence. The heat-setting of the film follows at oven temperatures of from 180 to 260° C., preferably from 220 to 250° C. The film is then cooled and wound.

In one preferred embodiment, the heat-setting takes place at from 220 to 250° C., and the film is relaxed transversely at this temperature by at least 1%, preferably at least 2%.

In another preferred embodiment, the heat-setting takes place at from 220 to 250° C., and the film is relaxed transversely at this temperature by at least 1%, preferably at least 2%, and then again transversely relaxed, again by at least 1%, preferably at least 2%, at temperatures of from 180 to 150° C. in the cooling phase.

In another preferred embodiment, the film is stretched in MD and TD by a factor of at least 3, this stretching taking place in a simultaneous frame. The heat-setting takes place at from 220 to 250° C., and the film is longitudinally and transversely relaxed by at least 1% at this temperature.

The inventive single- or multi-layer films have the required good mechanical properties. For example, the modulus of elasticity in at least one direction of the film (longitudinal direction (MD) and/or transverse direction (TD)) is $\geq 500$ N/mm$^2$, preferably $\geq 2000$ N/mm$^2$, and particularly preferably $\geq 4000$ N/mm$^2$.

The combination of properties of the inventive films makes them suitable for a wide variety of applications, for example for printed circuit boards, ribbon cables, smart cards, RFID labels, membrane keyboards, and film-based circuits of any type.

The individual properties are measured in the examples to the following standards or by the following methods:

Test Methods

Mechanical Properties

Modulus of elasticity, ultimate tensile strength, tensile strain at break, and $F_5$ value are measured longitudinally and transversely to ISO 527-1-2 with the aid of tensile strain measurement equipment (Zwick 010, DE).

Shrinkage

Thermal shrinkage is determined on square film samples with an edge length of 10 cm. The specimens are measured precisely (edge length $L_O$) and heat-conditioned for 15 minutes at 200° C. in a convection oven, and then measured precisely at room temperature (edge length L). Shrinkage is given by the equation shrinkage [%]=100·$(L_O-L)/L_O$ Measurement of Average Diameter $d_{50}$ Average diameter $d_{50}$ is determined by means of a laser on a Malvern Mastersizer by the standard method. An example of other measurement equipment is the Horiba LA 500 or Sympathec Helos, which use the same principle of measurement. For this, the specimens are placed with water in a cell, which is then placed in the measurement equipment. The measurement procedure is automatic and also includes the mathematical determination of $d_{50}$ value.

Figure 1:
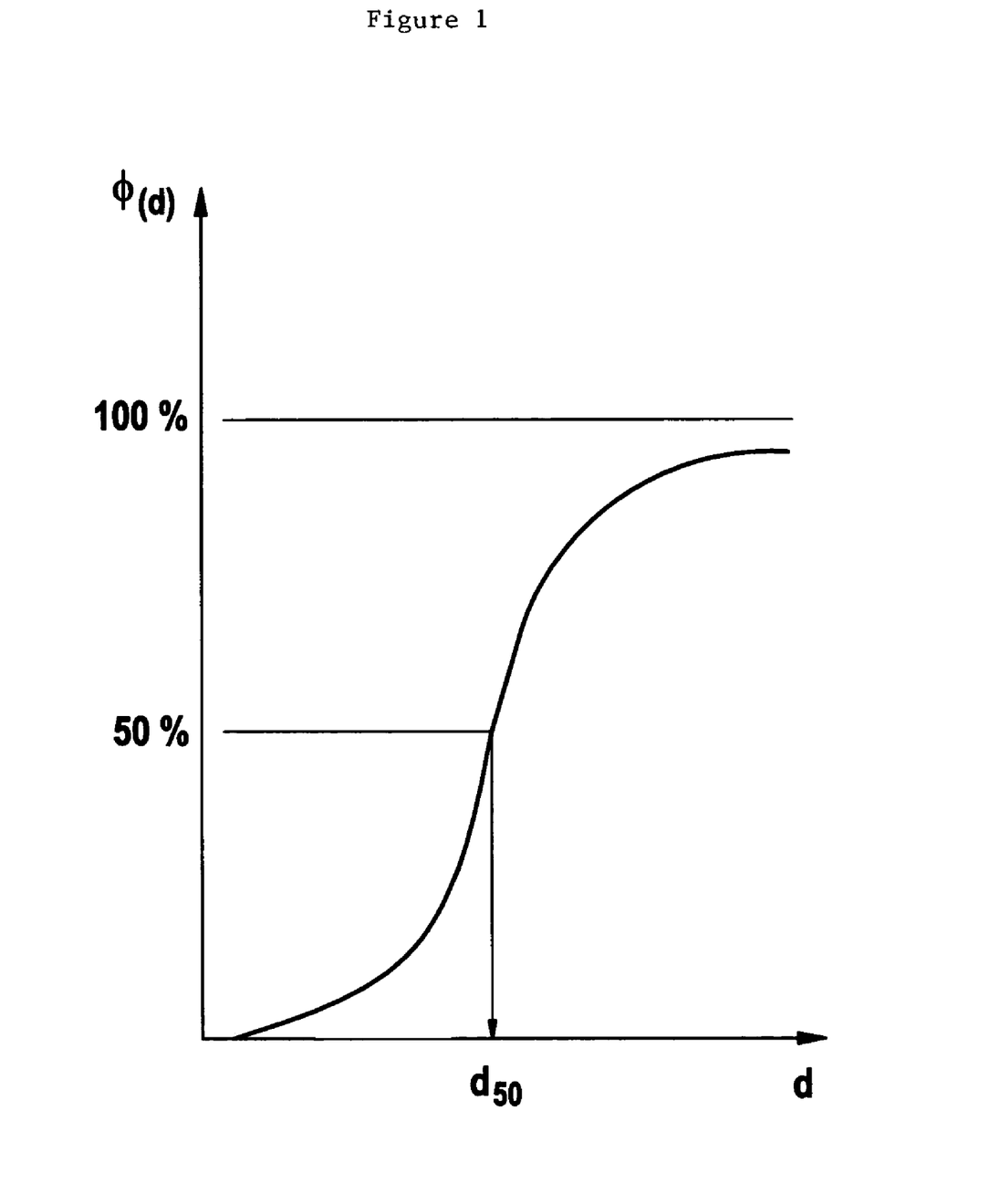
FIG. 1 is a graphical illustration of an exemplary cumulative particle size distribution curve.

The $d_{50}$ value here is defined as the value determined from the (relative) cumulative particle size distribution curve: the point of intersection of the 50% ordinate value with the cumulative curve immediately gives the desired $d_{50}$ value on the abscissa axis. FIG. 1 provides further illustration of what is meant here.

Film Production

Polymer chips were mixed in the ratios stated in the examples and in each case were melted in twin-screw extruders, without predrying. The molten polymer extrudates were combined in a coextrusion die and drawn off by way of a take-off roll (roll temperature 20° C.) The film was stretched by a factor of 3.5 in the machine direction at 116° C. (film temperature in the stretching gap), and transverse stretching by a factor of 3.2 was carried out in a frame at 110° C. The film was then heat-set at 229° C. and relaxed transversely by 1% at temperatures of from 229 to 200° C. and again by 1% at temperatures of from 180 to 150° C. The production speed (final film speed) was 300 m/min. Final film thickness: 100 µm.

EXAMPLES

The following raw materials are used in the examples:

Masterbatch MB1

15% by weight of PK3095 from Ferro and 85% by weight of polyethylene terephthalate RT49 (PET) from Kosa (DE)

Masterbatch MB2

10% by weight of AEROXIDE® Alu C Al$_2$O$_3$ from Degussa (DE) ($d_{50}$ of aggolmerates about 300 nm; primary particle $d_{50}$ about 50 nm) and 90% by weight of polyethylene terephthalate RT49 (PET)

Masterbatch MB3

15% by weight of NANOARC® Copper Oxide CuO nanoparticles from Nanophase Technologies Corporation, Illinois, USA, and 85% by weight of polyethylene terephthalate RT49 (PET)

Masterbatch MB4

15% by weight of Pigment Black 26 (Fe$_2$O$_3$/MnO$_2$/SiO$_2$/Al$_2$O$_3$) from Aniroz Pigments Limited (IN) and 85% by weight of polyethylene terephthalate RT49 (PET)

Masterbatch MB5

15% by weight of SPEZIALSCHWARZ® 4 from Degussa (DE) and 85% by weight of polyethylene terephthalate (PET)

Polymer P1

100% by weight of polyethylene terephthalate RT49

Polymer P2

25% by weight of AEROSIL® 90 from Degussa (DE), 5% by weight of PK3095 from Ferro and 70% by weight of polybutylene terephthalate (PBT)

Polymer P3

100% by weight of poly(m-xyleneadipamide) (MCD6) from Mitsubishi Gas Chemical Co., product name Nylon MXD6® 6001 with a melt viscosity of 1400 poise Polymer P4

100% by weight of GRIVORY® G 21 amorphous polyamide from Ems Chemie (CH)

Example 1

An ABC film with a base layer thickness of 94 µm and 3 µm for each of the outer layers A and C was produced as stated above.

Raw material mixture for outer layer A: 50% by weight of MB1; 10% by weight of MB2; 10% by weight of MB4; 20% by weight of P1; 10% by weight of P3

Raw material mixture for base layer B: 100% of P1

Raw material mixture for outer layer C: 20% by weight of MB2; 80% by weight of P1

Example 2

An ABC film with a base layer thickness of 94 µm and 3 µm for each of the outer layers A and C was produced as stated above.

Raw material mixture for outer layer A: 60% by weight of MB3; 10% by weight of MB2; 10% by weight of MB5; 12% by weight of P1; 8% by weight of P4

Raw material mixture for base layer B: 100% of P1

Raw material mixture for outer layer C: 20% by weight of MB2; 80% by weight of P1

Example 3

An ABC film was produced with dimensions the same as those in example 1.

Raw material mixture for outer layer A: 60% by weight of MB3; 10% by weight of MB2; 12% by weight of P1; 18% by weight of P4

Raw material mixture for base layer B: 100% of P1

Raw material mixture for outer layer C: 20% by weight of MB2; 80% by weight of P1

Example 4

A film was produced with dimensions the same as those in example 1.

Raw material mixture for outer layer A=base layer B and outer layer C: 50% by weight of MB3; 10% by weight of MB2; 10% by weight of MB5; 22% by weight of P1; 8% by weight of P4

Comparative Example 1

An attempt was made to use the polymer P2 (based on the polymer from the example in EP-A-1 274 288) to produce, as stated above, an ABA film with a base layer thickness of 46 µm and 2 µm for each of the outer layers A.

Raw material mixture for outer layer A: 100% by weight of P2

Raw material mixture for base layer B: 100% by weight of P2

Orientation of the film proved to impossible, because every attempt at stretching led to break-off. It was impossible to produce a film.

Comparative Example 2

An ABC film was produced with dimensions the same as those in example 1.

Raw material mixture for outer layer A: 50% by weight of MB1; 10% by weight of MB2; 10% by weight of MB5; 30% by weight of P1

Raw material mixture for base layer B: 100% of P1

Raw material mixture for outer layer C: 20% by weight of MB2; 80% by weight of P1

Comparative Example 3

Inventive example 1 was repeated. However, the heat-setting did not take place as stated above at 229° C., but at 150° C., and no relaxation took place.

The properties of the films from inventive examples 1 to 4 and from comparative examples 2 and 3 can be seen in the table.

Conductor Track Production

In the region of the conductor tracks to be applied, the films produced were irradiated by a laser (triple-frequency Nd: YAG laser ($\lambda$=355 nm) from LPKF AG (DE), at an intensity which generates a very small amount of ablation, associated with structured nucleation. After brief treatment in an ultrasound cleaning bath containing demineralized water, the film is passed through a commercially available chemically reductive copper-plating bath. Here, the conductor tracks are constructed in the irradiated regions. Ablation was from 0.5 to 1.0 µm.

Results of Conductor Track Production

The conductor tracks generated were assessed visually by means of an optical microscope (incident light) at 20× magnification. The coherence of the copper layer was evaluated visually and allocated to the following categories: good, less good, and poor.

To assess the adhesion of the metal deposited on the film, a conductor track (length: 2.5 cm; width: 3 mm) was produced as described above via activation followed by copper-plating. An adhesive strip (SCOTCH® Tape 600 from 3M (US)) was then adhesive-bonded transversely across the conductor tracks. The adhesive strip was peeled away at an angle of 90° with respect to the film surface, at a constant velocity of 0.2 cm/s. The adhesive strip was inspected under an optical microscope (incident light) at 20× magnification. If no separated copper was visible on the adhesive surface, the adhesion of the copper on the film was evaluated as adequate (+), and otherwise the adhesion was inadequate (−)

TABLE

| Example | MD modulus of elasticity in n/mm² | TD modulus of elasticity in n/mm² | MD shrinkage at 200° C. | TD shrinkage at 200° C. | Conductor track production | Metal adhesion |
|---|---|---|---|---|---|---|
| 1 | 4200 | 5200 | 4.8 | 1.8 | very good | + |
| 2 | 4300 | 5000 | 4.2 | 1.9 | very good | + |
| 3 | 4200 | 5000 | 4.5 | 1.8 | moderate*) | + |
| 4 | 3850 | 4300 | 3.8 | 1.7 | very good | + |

TABLE-continued

|  | MD modulus of elasticity in n/mm² | TD modulus of elasticity in n/mm² | MD shrinkage at 200° C. | TD shrinkage at 200° C. | Conductor track production | Metal adhesion |
|---|---|---|---|---|---|---|
| Comparative example |  |  |  |  |  |  |
| 1 | no film obtained | no film obtained | no film obtained | no film obtained | no film obtained | no film obtained |
| 2 | 4300 | 5200 | 4.2 | 2.1 | very good | – |
| 3 | 4500 | 5600 | 20 | 23 | good**) | + |

*)if the intensity and irradiation time were the same as in inventive examples 1 and 2, conductor track quality was markedly poorer to inadequate. However, if the irradiation time was increased good values could be achieved.
**)However, creases formed after laser irradiation and prevent further use of the film.

The invention claimed is:

1. A single- or multilayer, at least monoaxially stretched thermoplastic polymer film with a thickness of from about 5 to 500 μm, which comprises, based in each case on the film layer, from about 0.5 to 15% by weight of a metal compound a) capable of activation by electromagnetic radiation and thereby form elemental metal nuclei, where at least one layer is comprised of a thermoplastic polymer having a minimum number of amide groups, said film exhibiting a modulus of elasticity in at least one film direction (longitudinal direction (MD) and/or transverse direction (TD)) of greater than or equal to about 500 N/mm².

2. The film as claimed in claim 1, wherein the thermoplastic polymer is a polyester, a polyamide, or a mixture comprised of polyester and polyamide.

3. The film as claimed in claim 2, wherein the polyester is a polyethylene terephthalate, polybutylene terephthalate, or polyethylene naphthalate, or a mixture thereof.

4. The film as claimed in claim 1, which also comprises a material b) which absorbs radiation and comprises other additives.

5. The film as claimed in claim 4, wherein the material b) which absorbs radiation is graphite, carbon black, inorganic black pigment or organic black pigment.

6. A film according to claim 4, wherein said film comprises from about 1.5 to 10% by weight of component a) and from about 0.5 to 5% by weight of component b), based in each case on the film.

7. The film as claimed in claim 1, wherein the metal compound a) capable of activation by radiation is an electrically non-conducting organic or inorganic compound.

8. The film as claimed in claim 1, which comprises other particulate additives.

9. The film as claimed in claim 8, which comprises silicon dioxide or $Al_2O_3$.

10. The film as claimed in claim 8, which comprises from about about 0.1 to 20% by weight of silicon dioxide particles or of $Al_2O_3$ particles, the $d_{50}$ value for these particles being less than or equal to about 1 μm.

11. The film as claimed in claim 1, which has at least two layers and is comprised of a base layer and of at least one outer layer.

12. The film as claimed in claim 11, which has an A-B-A or A-B-C three-layer structure.

13. The film as claimed in claim 11, wherein the thickness of the outer layer(s) is in the range from about 0.1 to 10 μm and the thickness of the base layer is calculated from the difference between the total thickness of the film and the thickness of the outer and any optional intermediate layers(s) applied.

14. The film as claimed in claim 1, which comprises a recycled polymer.

15. A process for producing a single- or multilayer at least monoaxially stretched thermoplastic polymer film as claimed in claim 1 with a thickness of from 5 to 500 μm, which comprises extruding through a flat-film die one or more melts corresponding to the individual layer(s) of the film, where at least one of the melts comprises a thermoplastic polymer having a minimum number of amide groups and further comprises a metal compound a) capable of activation by electromagnetic radiation, cooling the resultant film, reheating it, and then orienting it in at least one direction, and then heat-setting it.

16. The process as claimed in claim 15, wherein at least one of the melts also comprises a material b) which absorbs radiation and optionally comprises other particulate additives.

17. The process as claimed in claim 16, wherein the amount of component a) added is from about 0.5 to 15% by weight and the amount of component b) added is from about 0.1 to 15% by weight, based in each case on the film, and wherein the addition takes place by way of masterbatch technology.

18. Printed circuit boards, ribbon cables, smart cards, RFID labels, membrane keyboards, or film-based circuits comprising film according to claim 1.

19. A single- or multilayer, at least monoaxially stretched thermoplastic polymer film which comprises, based in each case on the film layer, from about 0.5 to 15% by weight of a metal compound a) capable of activation by electromagnetic radiation and thereby form elemental metal nuclei, where at least one layer comprises a thermoplastic polymer having a minimum number of amide groups, wherein the metal compound a) is a metal oxide or a spinel.

20. A multilayered biaxially oriented polyester film comprising a metal compound capable of activation by electromagnetic radiation and thereby form elemental metal nuclei, said layer comprising said metal compound further comprising (i) thermoplastic polymer containing at least 1% by weight of polyamide and at least one of either (ii) a material b) which absorbs radiation in the wavelength range of die radiation source used to form the metal nuclei or (iii) $SiO_2$ and/or $Al_2O_3$, said film exhibiting a modulus of elasticity in at least one film direction (longitudinal direction (MD) and/or transverse direction (TD)) of greater than or equal to about 500 N/mm².

* * * * *

UNITED STATES PATENT AND TRADEMARK OFFICE
CERTIFICATE OF CORRECTION

| | | |
|---|---|---|
| PATENT NO. | : 7,083,848 B2 | Page 1 of 1 |
| APPLICATION NO. | : 11/037624 | |
| DATED | : August 1, 2006 | |
| INVENTOR(S) | : Kliesch et al. | |

It is certified that error appears in the above-identified patent and that said Letters Patent is hereby corrected as shown below:

Title Page

Item [30], Foreign Application Priority Data delete "Dec. 7, 2004" and insert --Jan. 27, 2004--

Claims

Column 14

Claim 20, Line 60, delete "die" insert --the--

Signed and Sealed this

Seventeenth Day of October, 2006

JON W. DUDAS
*Director of the United States Patent and Trademark Office*